United States Patent [19]

Rolff

[11] Patent Number: 5,770,956
[45] Date of Patent: Jun. 23, 1998

[54] MEASUREMENT AMPLIFIER

[75] Inventor: Norbert Rolff, Horrem, Germany

[73] Assignee: Leybold Aktiengesellschaft, Germany

[21] Appl. No.: 578,574

[22] PCT Filed: May 26, 1994

[86] PCT No.: PCT/EP94/01686

§ 371 Date: Jun. 13, 1996

§ 102(e) Date: Jun. 13, 1996

[87] PCT Pub. No.: WO95/00856

PCT Pub. Date: Jan. 5, 1995

[30] Foreign Application Priority Data

Jun. 23, 1993 [DE] Germany ............... 43 20 817.7

[51] Int. Cl.⁶ .............. H03C 3/00; G06G 7/64
[52] U.S. Cl. .............. 327/103; 327/336; 327/101
[58] Field of Search ............... 327/101, 102, 327/103, 91, 93, 335, 336

[56] References Cited

U.S. PATENT DOCUMENTS

| 3,944,920 | 3/1976 | Borer ............................. 324/111 |
| 4,620,148 | 10/1986 | Davison et al. ................ 324/99 D |
| 4,697,151 | 9/1987 | Butler ............................ 330/2 |
| 4,839,788 | 6/1989 | Tullsen .......................... 327/101 |
| 4,992,673 | 2/1991 | Gessaman et al. ............. 327/101 |
| 5,585,748 | 12/1996 | Yamaguchi et al. ........... 327/101 |

FOREIGN PATENT DOCUMENTS

| 2634559 | 1/1990 | France ............. G01R 19/00 |
| 3322471 | 1/1985 | Germany ........... G01R 19/00 |

OTHER PUBLICATIONS

Nullpunktfehler des Operationsverstarkers, 1973; pp. 123–126.

Primary Examiner—Toan Tran
Attorney, Agent, or Firm—Wall Marjama & Bilinski

[57] ABSTRACT

A measurement amplifier has an integrator circuit (2) and a reference current source (33) which supplies a reference current to the input of the integrator when the voltage set at the output of the integrator (2) exceeds or falls below a reference voltage. In addition, a differentiator, for example, is provided which receives the output voltage of the integrator (2) and supplies an output signal which is proportional to the variation in time of the output voltage of the integrator. The output voltage of the differentiator is proportional to the input current to be measured by the measurement amplifier. The measurement amplifier allows very weak input currents to be rapidly and accurately detected.

7 Claims, 3 Drawing Sheets

MEASUREMENT AMPLIFIER

FIELD OF INVENTION

The invention relates to a measurement amplifier.

BACKGROUND OF THE INVENTION

Charge balance amplifiers are known which supply an output voltage, the frequency of which is proportional to the input current. The known charge balance amplifiers have an integrator which includes an integrating capacitor. Moreover, the known charge balance amplifiers have a reference current source. The reference current source supplies a reference current to an input node for a pre-defined period of time, if the voltage appearing at the output of the integrator exceeds or falls below a reference voltage level. With the reference current source active, the capacitor discharges. The frequency at which the charging and discharging process occurs is proportional to the input current.

If such a charge balance amplifier is employed in the measurement of very weak currents, the frequency is very low so that the acquisition of the measurement data is problematic. Variations in the input current which is to be measured can not be immediately detected since the time for the charging process is too long at very weak input currents.

SUMMARY OF THE INVENTION

It is the task of the present invention to create a measurement amplifier which permits rapid acquisition of the measurement data.

In the measurement amplifier according to the present invention a circuit is provided which receives the voltage which appears at the output of the integrator. This circuit may be a differentiator, for example. The differentiator supplies an output voltage which is proportional to the variation in time of the voltage. The output voltage of the differentiator is proportional to the input current of the measurement amplifier which is to be measured. Moreover, the voltage variation can be performed also through the measurement at two points of time, at least.

The measurement amplifier according to the present invention permits the acquisition of very weak currents and may be employed, for example, in the area of vacuum technology for the measurement of the ion currents generated by an ionization vacuum gauge, where said currents have an order of magnitude beginning at approximately $10^{-15}$A.

The output of the differentiator is preferably processed when the reference current source has been switched off and when the integration capacitor is being charged. From the variation in time of the voltage occurring at the output of the integrator it is possible to conclude as to the magnitude of the input current. The greater the input current, the faster the output voltage of the operational amplifier will attain the level of the reference voltage.

Moreover, in the acquisition of very weak currents there arises the problem that the output voltage of the circuit operating as an integrator, for example, an operational amplifier, and the switch of the reference current source are influenced by a fault or leakage current which varies over time. To detect the fault current, a capacitor may be connected in series with the input of the operational amplifier. Moreover, a switching component is provided which, when closed, shorts the capacitor. From the difference in the measured voltage variation at the output of the integrator when the switching component is open and closed, it is possible to determine the fault current. For the purpose of compensating the fault current, a compensation current source is preferably provided which supplies an adjustable compensation current which is applied to the input of the circuit used as an integrator. In the case of a correctly set up fault current compensation, the compensation current is set up in such a manner that the output voltages of the operational amplifier operating as a differentiator are equal when the switching component is closed and open. Through opening and closing of the switching component, and by changing the magnitudes of the compensation current, it is possible to entirely compensate the fault current.

Moreover, there is the possibility of not, or only partly compensating the fault current, and to detect and eliminate it later on instead.

In the following, a design example of the present invention is described in close detail and by referring to the drawing figures.

Figure 1:
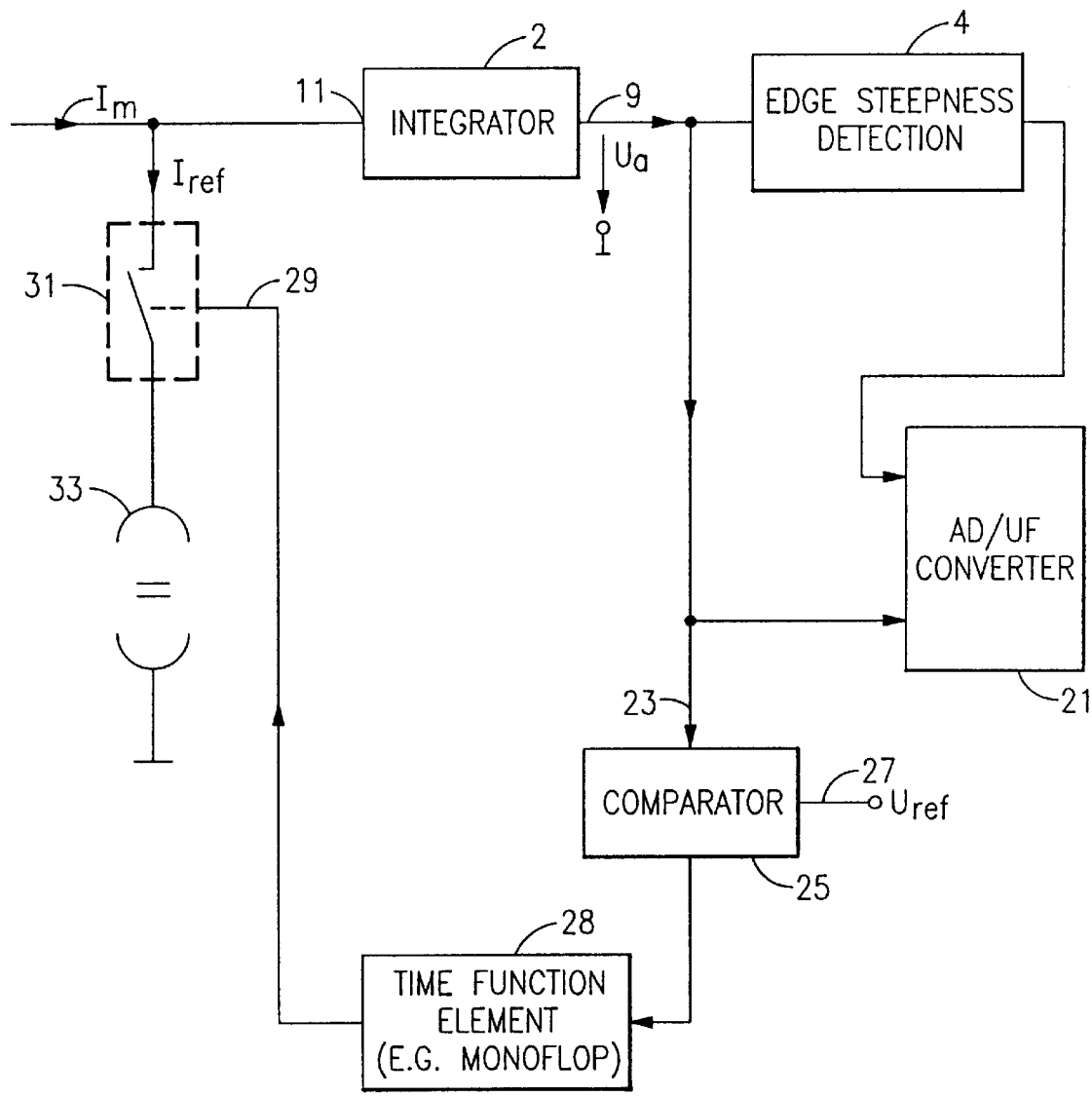
FIG. 1 shows the block diagram of the measurement amplifier.
Figure 2:
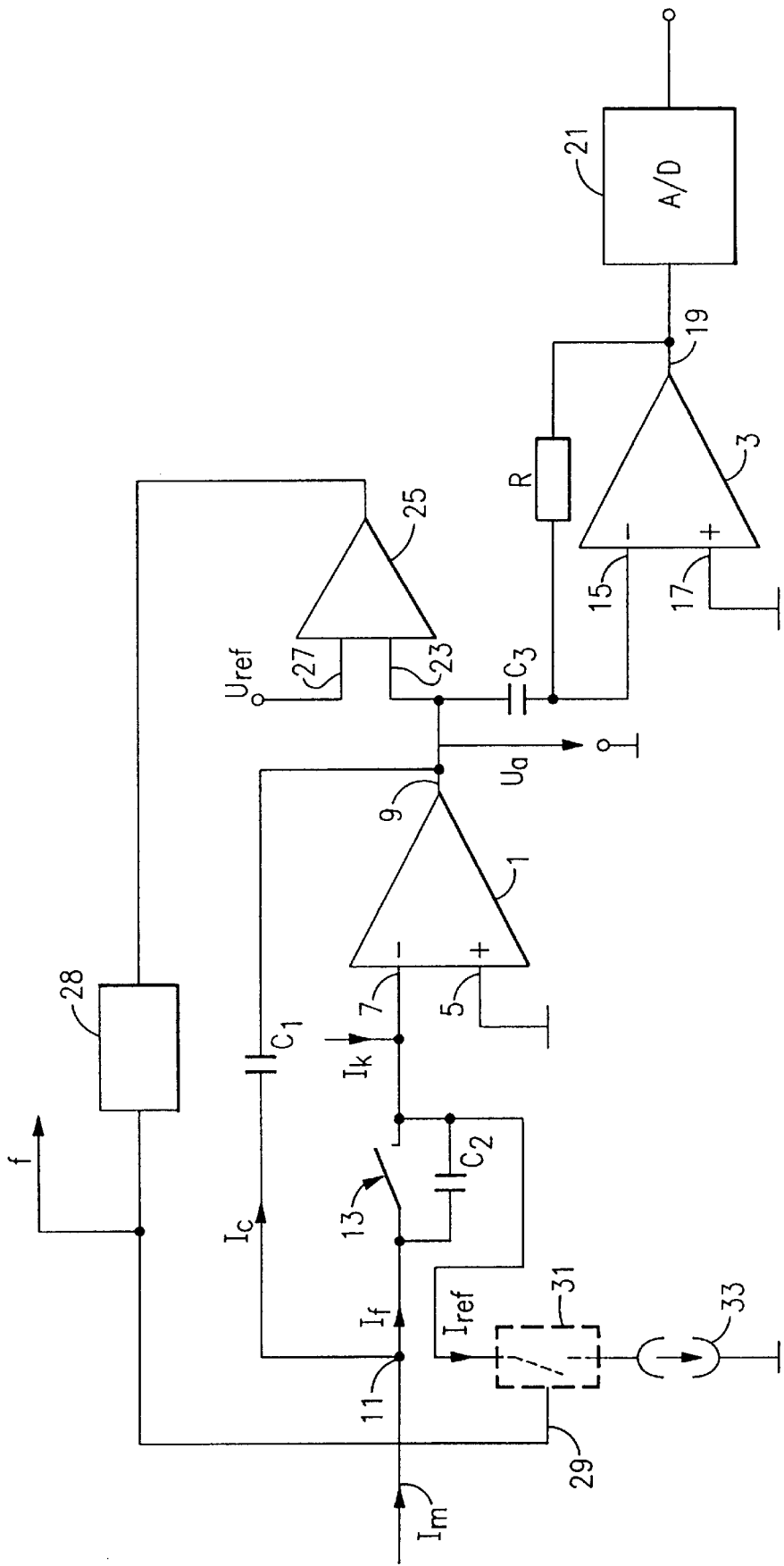
FIG. 2 shows a circuit diagram of the measurement amplifier of FIG. 1 which consists of an integrator followed by a differentiator.

DETAILED DESCRIPTION OF THE INVENTION:

Referring to FIGS. 1 and 2, the measurement amplifier consists of an operational amplifier 1 operating as an integrator and an operational amplifier 3 wired as a differentiator. The non-inverting input 5 of the operational amplifier 1 is connected to ground. In the feedback branch between the inverting input 7 and the output 9 of the operational amplifier there are two series connected capacitors $C_1$, $C_2$, whereby the input current $I_m$ which is to be measured, is applied to the common connection point 11 of the two capacitors $C_1$, $C_2$.

A switching component 13 which is in parallel to capacitor $C_2$, which in turn is connected between connection point 11 and the inverting input 7 of the operational amplifier 1, shorts capacitor $C_2$ when closed. The output 9 of the operational amplifier 1 is connected via a capacitor $C_3$ to the inverting input 15 of operational amplifier 3. The non-inverting input 17 of operational amplifier 3 is connected to ground, and the feedback branch between the inverting input 15 and the output 19 of the operational amplifier 3 includes a resistor R.

Moreover, the measurement amplifier has an analogue/digital converter 21 which processes the output signal of the operational amplifier 3 operating as a differentiator. The output of operational amplifier 1 operating as an integrator 2 is connected to the input 23 of a comparator 25. A reference voltage $U_{ref}$, which is produced by a reference voltage source not shown in FIG. 2, is applied to the other input 27 of comparator 25. The output of comparator 25 is connected via a time dependant stage, a monoflop 28, for example, to a control input 29 of an electronic switch 31. In the closed state, the electronic switch 31 connects a reference current source 33 to the input 7 of operational amplifier 1. Moreover, the measurement amplifier has a compensation current source which supplies an adjustable compensation current $I_k$ and which is applied to the inverting input 7 of the operational amplifier 1.

Operation of the circuit is now described in the following with reference to FIG. 3.

Let it be assumed that switching component 13 be closed and that the fault current $I_f$ and the compensation current $I_k$ are zero. The current $I_c$ in the feedback branch corresponds to the input current $I_m$ which is to be measured. The voltage $U_a$ at the output 9 of the operational amplifier 1 operating as an integrator reduces continuously. When the output voltage is equal to the reference voltage $U_{ref}$, the output of the comparator 25 swings to a positive value and the monostable stage is driven which generates, for a pre-defined period of time T, a control signal for closing the electronic switch 29. As long as the electronic switch 29 is in the closed state, the reference current $I_{ref}$ flows and the capacitor $C_1$ is discharged since the reference current is greater than the input current. After the delay time T has elapsed, the electronic switch 31 opens again and the reference current source 33 is switched off, so that a new charging cycle begins. The current source 33 is driven at such a mark-to-space ratio that the charge balance is zero. The frequency of the square-wave at the output of the monostable stage is proportional to the input current $1_m$ and may be measured with a frequency counter.

Figure 3:
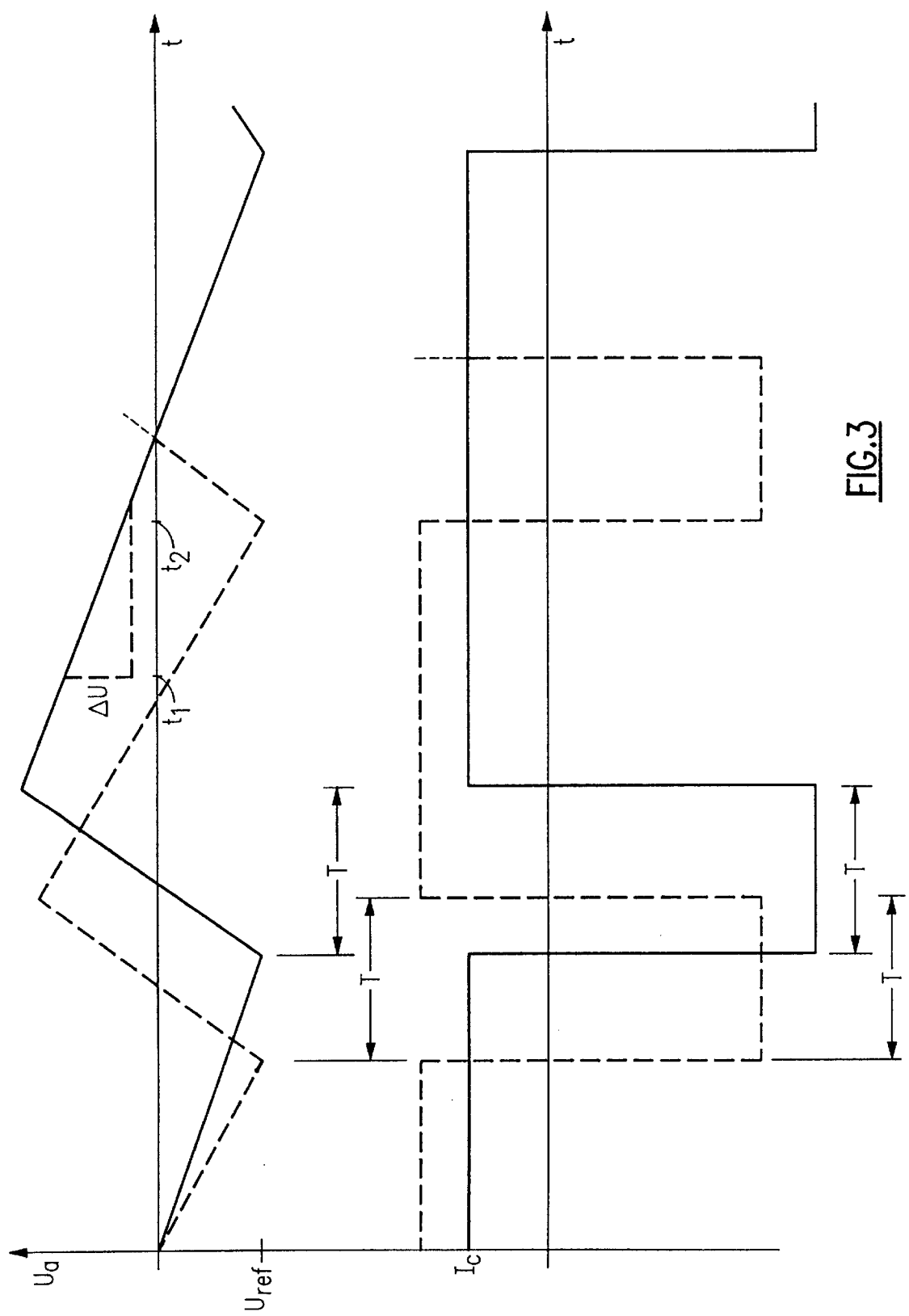
FIG. 3 shows the voltage at the output of the operational amplifier operating as an integrator, and the current flowing in the feedback branch as a function of time.

For the case that the input current is increased, the charging cycle of capacitor $C_1$ reduces as shown in FIG. 3 by the broken line. The higher the input current is, the faster the output voltage $U_a$ of operational amplifier 1 will attain the reference voltage $U_{ref}$. From the voltage difference $\Delta U$ of the voltage which appears at the output of operational amplifier 1 at points of time $t_1$, and $t_2$, it is possible to conclude as to the magnitude of the input current $I_m$. The differentiator detects the variation in time of the voltage during the charging cycle and generates an output voltage which is proportional to the input current.

If very weak input currents are to be measured, the magnitude of the current is determined from the variation in time of the voltage at the output of operational amplifier 1, i.e. from the differentiator. At stronger input currents, the frequency of the square-wave voltage at the output of the monostable stage 28 can be measured directly, and the magnitude of the input current is determined directly from the frequency.

The fault current $I_f$ is compensated under the assumption that the fault current is not caused by capacitors $C_1$ and $C_2$. For compensating the fault current, the compensation current $I_k$ is adjusted so that upon opening and closing of switching component 13, the output voltage of operational amplifier 3 remains the same. If at the signal output the same output voltage is present when the switching component is open or closed, then the fault current has been compensated, and the output voltage then only depends on the measurement current $I_m$. Consequently very weak currents can be measured very accurately with the measurement amplifier. For determination of the compensation current the input current need not be switched off, so that the acquisition of measurement data is also possible during the compensation process.

I claim:

1. A measuring amplifier comprising:
    an integrator for receiving a first input signal, having at least a first capacitor ($C_1$), and a reference current source which feeds-in a reference current ($I_{ref}$), at an input of the integrator for a predetermined time interval (T) when an output voltage ($U_a$) occurring at an output of the integrator exceeds or falls below a reference voltage ($U_{ref}$);
    a circuit for receiving the output voltage ($U_a$) and supplying a variable voltage signal which is proportional the change in the output voltage as a function of time;
    a second capacitor ($C_2$) connected to the input of the integrator and;
    a switching element connected in parallel to the second capacitor ($C_2$), the integrator receiving said input signal through the parallel second capacitor and the switching element.

2. A measuring amplifier according to claim 1, including a compensation current source for supplying a fixed or adjustable compensation current ($I_k$) to the input of the integrator.

3. A measuring amplifier according to claim 2, wherein said integrator includes an operational amplifier, and in which the compensation current ($I_k$) is set such that the voltages at an output of the operational amplifier are identical when the switching element is closed and open.

4. A measuring amplifier according to claim 1, including a differentiator for receiving the output voltage.

5. A measuring amplifier according to claim 4, including at least one converting means for receiving the output voltage of the differentiator.

6. A measuring amplifier according to claim 1, wherein the integrator includes an operational amplifier having at least one negative feedback arm, said feedback arm containing said at least said first capacitor ($C_1$), between an inverting input and an output of the operational amplifier.

7. A measuring amplifier according to claim 5, wherein said at least one converting means includes an analog/digital converter.

* * * * *